United States Patent [19]

Okita

[11] Patent Number: 5,219,768
[45] Date of Patent: Jun. 15, 1993

[54] METHOD FOR FABRICATING A SEMICONDUCTOR DEVICE

[75] Inventor: Yoshihisa Okita, Tokyo, Japan

[73] Assignee: Oki Electric Industry Co., Ltd., Tokyo, Japan

[21] Appl. No.: 640,423

[22] PCT Filed: May 9, 1990

[86] PCT No.: PCT/JP90/00590

§ 371 Date: Jan. 9, 1991

§ 102(e) Date: Jan. 9, 1991

[87] PCT Pub. No.: WO90/13916

PCT Pub. Date: Nov. 15, 1990

[30] Foreign Application Priority Data

May 10, 1989 [JP] Japan .................. 1-115186
May 10, 1989 [JP] Japan .................. 1-115187

[51] Int. Cl.$^5$ .................................. H01L 21/265
[52] U.S. Cl. .................................. 437/34; 437/37; 437/186; 437/968; 437/193
[58] Field of Search .......... 437/34, 57, 193, 968, 437/940, 37, 186; 148/DIG. 117

[56] References Cited

U.S. PATENT DOCUMENTS

| | | | |
|---|---|---|---|
| 4,480,375 | 11/1984 | Cottrell et al. | 29/576 B |
| 4,731,341 | 3/1988 | Kawakatsu | 437/31 |
| 4,783,422 | 11/1988 | Kawakatsu | 437/31 |
| 4,866,000 | 9/1989 | Okita | 437/31 |
| 4,873,200 | 10/1989 | Kawakatsu | 437/31 |
| 5,059,596 | 10/1991 | Havemann | 437/34 |
| 5,100,815 | 3/1992 | Bubone et al. | 437/34 |

FOREIGN PATENT DOCUMENTS

| | | | |
|---|---|---|---|
| 72967 | 3/1983 | European Pat. Off. | 437/34 |
| 0118709 | 9/1984 | European Pat. Off. | |
| 0276693 | 8/1988 | European Pat. Off. | |
| 0293588 | 12/1988 | European Pat. Off. | |
| 0428738A1 | 5/1991 | European Pat. Off. | |
| 54-112165 | 1/1979 | Japan | 437/34 |
| 56-61139 | 5/1981 | Japan | 437/34 |
| 57-10963 | 1/1982 | Japan | |
| 58-10868 | 1/1983 | Japan | |
| 62-287160 | 12/1986 | Japan | |
| 63-261746A | 10/1988 | Japan | |
| 2-189965 | 7/1990 | Japan | 437/968 |

*Primary Examiner*—George Fourson
*Attorney, Agent, or Firm*—Edward D. Manzo; John J. King

[57] ABSTRACT

Selective ion implantation on the respective polysilicon is performed by utilizing a low temperature accelerated oxidation phenomenon in polysilicon with a high impurity concentration and the dependence of an accelerated energy of the impurity projection range in the ion implantation, so that formation of a mask resist pattern by photoetching is not necessary for each incorporation step of an impurity.

A base (source drain) electrode is formed by polysilicon separated by a selective oxidation method and a selective oxide film in connection with an emitter (gate) region is removed to form a side wall spacer on the inner surface of the emitter (gate) region, thus loading to formation of the emitter (gate) in a reduced size.

6 Claims, 18 Drawing Sheets

FIG. 1D
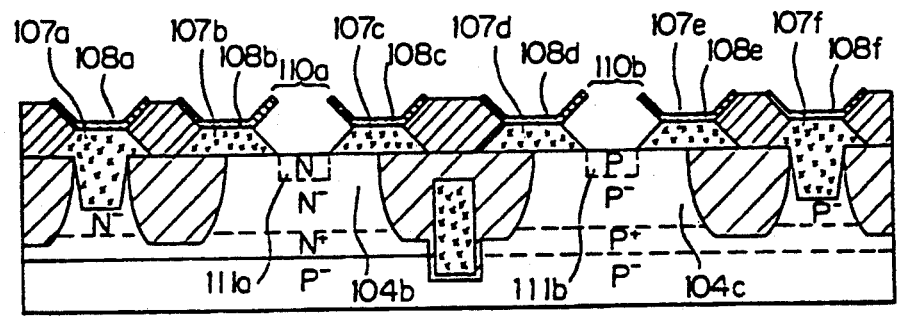
FIG. 1E
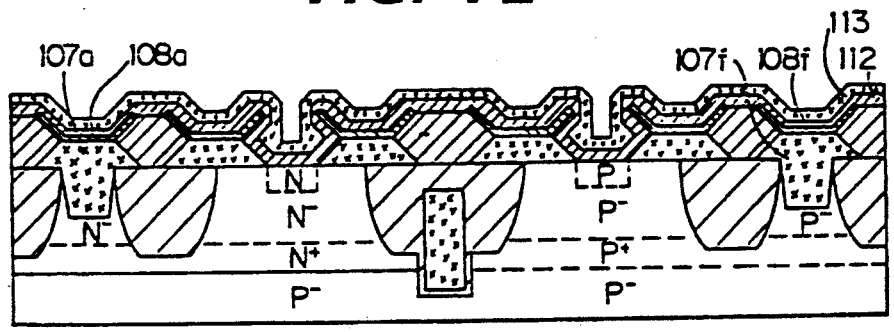
FIG. 1F
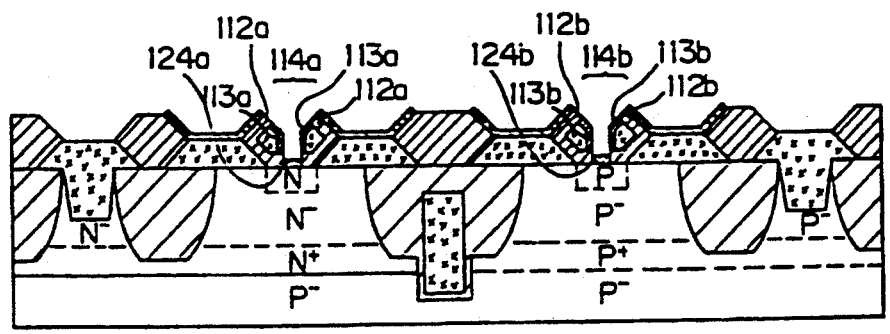

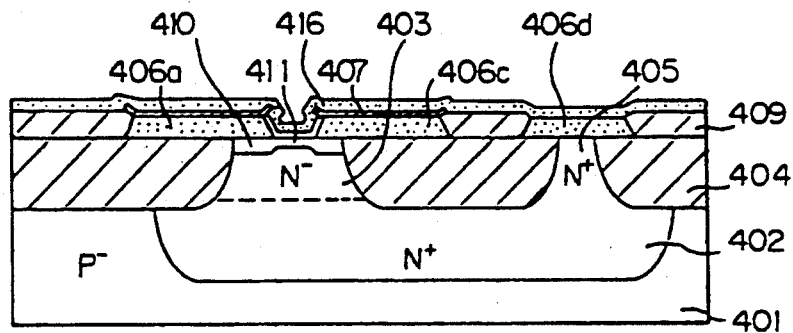
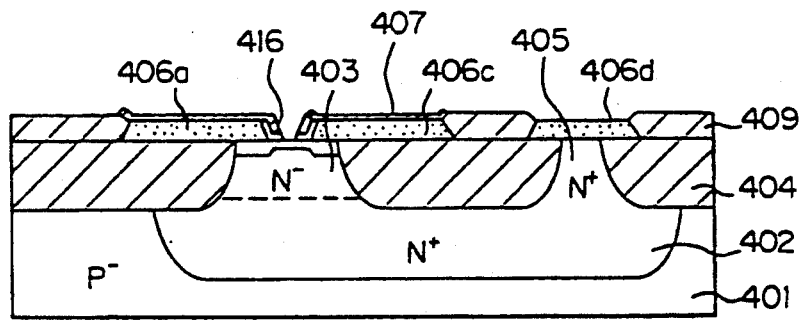
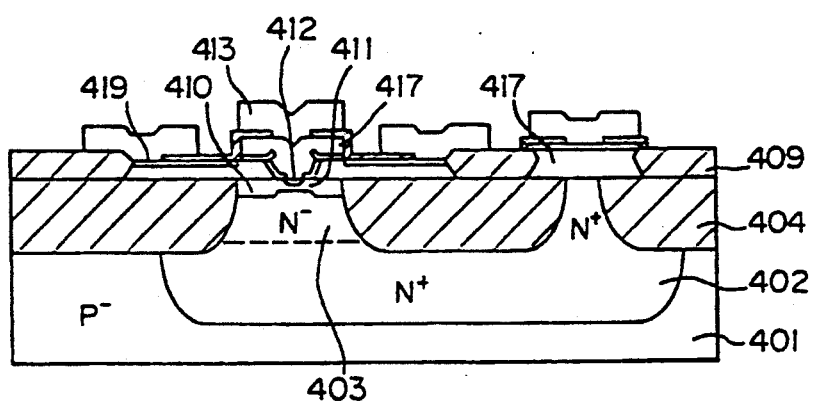

5,219,768

METHOD FOR FABRICATING A SEMICONDUCTOR DEVICE

TECHNICAL FIELD

This invention relates to a method for fabricating an active element in semiconductor integrated circuits and particularly high speed highly integrated semiconductor integrated circuits.

TECHNICAL BACKGROUND

In the fields of semiconductor integrated circuit devices which are applied particularly as required for high speed workability, it is usual to employ ECL/CML bipolar semiconductor integrated circuit devices. In the ECL/CML circuits, when power consumption and logical amplitude are made constant, the operating speed is determined depending on the parasitic capacitance of elements and interconnections which constitute the circuit and the base resistance and the gain-bandwidth product of a transistor. Of these, for the reduction of the parasitic capacitance, it is necessary to reduce the junction capacitance between the base and the collector of the transistor which greatly contributes to the operating speed. To this end, it is effective to use polysilicon in order that a base electrode is lead out to outside an element region thereby reducing the area of the base. In addition, it is generally adopted to use a method wherein polysilicon resistors and interconnections are formed on a thick field oxide film to reduce the parasitic capacitance thereof.

On the other hand, for the reduction of the base resistance, it is necessary that an extrinsic base layer be made low in resistance and is provided as closely to the emitter as possible and also to make the emitter shallow so that an intrinsic layer beneath the emitter is reduced with respect to the resistance. In order to enhance the gain-bandwidth product, it is effective to make a shallow junction between the emitter and the base along with a thin epitaxial layer of the collector.

As a prior technique which has been proposed for the purpose of realizing these modifications, a fabrication method disclosed in Japanese Patent Application No. 62-095358 is described.

FIGS. 4(A)–(F) are, respectively, sectional views of the steps of the technique. FIG. 5(a)–(f) are, respectively, enlarged views of peripheries of base and emitter regions for illustrating the steps of FIGS. 4(C)–(F) in more detail. It will be noted that part of the films is omitted in order to avoid complication of the drawings.

FIG. 4(A) shows a state wherein after element isolation, an about 3,000 angstrom thick polysilicon is formed and oxidized at approximately 200 angstroms on the surface thereof (not shown), followed by a selective formation of 1,000-2,000 angstrom thick nitride film at portion where a base electrode and a collector electrode are to be formed. Indicated at 401 is a P−-type silicon substrate, at 402 is an N+-type buried diffusion layer formed on the silicon substrate 401, at 403 is an N−-type epitaxial layer formed on the buried diffusion layer 402, at 404 is an element isolation oxide film formed on the silicon substrate 401 and the buried diffusion layer 402, at 406 is polysilicon formed on the epitaxial layer 403 and the element isolation oxide film 404, and at 407 is a nitride film formed on the polysilicon 406.

Next, as shown in FIG. 4(B), the polysilicon 406 is selectively oxidized to form polysilicon regions 406a, 406c and 406d. Reference numeral 409 indicates an oxide film of the polysilicon 406. Subsequently, the nitride film 407 on the collector electrode is selectively removed and phosphorus is subjected to ion implantation into the polysilicon 406d of the collector electrode and thermally treated to form an N+-type region 405 for reduction of the resistance of the collector. Thereafter, boron is ion implanted into the base electrode polysilicon 406a, 406c through the nitride film 407 at approximately $1-5 \times 10^{15}$ cm$^{-2}$, followed by annealing at a temperature of approximately 900° C., thereby uniformizing the concentration of the boron in the base electrode polysilicon 406a, 406c. Then, the emitter-forming region of the polysilicon oxide film 409 is selectively removed and the inner wall is oxidized to form an approximately 200 angstrom thick inner wall oxide film 414. Through diffusion from the polysilicon 406a, 406c, a P+-type extrinsic base 410 is formed. This state is shown in FIGS. 4(C) and 5(a).

Next, BF$^2$ is ion implanted at approximately $1-5 \times 10^{13}$ cm$^{-2}$ to form an active base 411, after which as shown in FIG. 4(D) and 5(b), an approximately 1,000 angstrom thick oxide film 415 and an approximately 2,000 angstrom thick polysilicon 416 are formed by CVD over the entire surface. It will be noted that in FIG. 4(D), the oxide film 415 formed by CVD is not shown.

Subsequently, reactive ion etching is used to etch the polysilicon 416, followed by further etching of the oxide film 414, 415 to make an opening in the emitter as shown in FIGS. 4(E) and 5(c). The polysilicon 416 and the CVD oxide film 415 are left only on the side walls as shown in FIG. 5(C), thereby allowing an emitter, which is smaller than the opening of the nitride film 407, to be self-alignedly opened. At the same time, as shown in FIG. 4(E), the collector electrode polysilicon 406d is exposed.

Next, as shown in FIG. 5(d), an approximately 3,000 angstrom thick polysilicon 417 is deposited over the entire surface and after oxidation of the surface thereof in approximately 200 angstroms in thickness, arsenic is ion implanted at approximately $10^{16}$ cm$^{-2}$.

As shown in FIG. 5(e), the oxide film 418, the polysilicon 417 and the nitride film 407 are etched, followed by thermal treatment to form an emitter 412 in the intrinsic base 411 by diffusion from the polysilicon 417.

A thin oxide film 418 is removed from the polysilicon 406a, 406c and 417, after which platinum is vacuum deposited, followed by thermal treatment to form a platinum silicide 419 on the surfaces of the polysilicon. At portions such as of a resistor which do not undergo any silicidation, the thin oxide film is left as it is. The platinum left unreacted on the oxide film is removed by aqua regia. Then, a CVD oxide film is deposited over the entire surface as shown in FIG. 5(f).

Finally, as shown in FIG. 4(F), contact holes are made to form an interconnection 413.

As described hereinabove, according to the fabrication method of the above technique, the emitter is formed in the selective oxide region of the polysilicon and the highly concentrated extrinsic base is formed through diffusion from the polysilicon left adjacent to the oxide region, so that the distance between the highly concentrated extrinsic base and the emitter can be significantly reduced. This allows easy formation of the emitter which is smaller in width than one attained by a minimum dimension of design. In addition, since the surface of the polysilicon with which the base electrode is brought to outside of the element region is converted to a silicide to an extent near the emitter and is thus rendered low in resistance, the base region is sufficient to be three times the minimum dimension of design, so that the base-collector junction capacitance can be reduced. Almost all the emitter junction is a junction with the intrinsic base with a low concentration, leading to the reduction of the emitter-base junction capacitance with the aid of the reduction in the width of the emitter.

Because the maximum depth of the junction can be made at not larger than 0.3 μm, the epitaxial layer can be made as thin as 1 μm or below, thereby shortening the transit time of the carrier through the depletion layer of collector. Moreover, the reduction in the junction capacitance results in shortage of the time constants of the collector and the emitter, thereby improving the gain-bandwidth product. Since, as described above, the base resistance and the parasitic capacitance of the transistor can be reduced and the gain-bandwidth product can be improved, remarkable speeding up can be achieved.

However, for the construction of high speed large capacity information communication systems, it is essential to realize high speed high integration LSIs of the analog digital hybird type. To this end, complementary devices are essential. In the above technique, for example, where a PNP transistor is used in combination with an NPN transistor used as a main element, it is inevitable to select:

(1) a lateral PNP transistor which has a structure of an NPN transistor from which an intrinsic base is eliminated and which includes one of P+-type diffusion layers (an extrinsic base of the NPN transistor) as an emitter, the other as a collector, and an N−-type epitaxial layer (a low concentration collector of the NPN transistor) as a base:

(2) a vertical PNP transistor which has a structure of an NPN transistor from which an emitter is eliminated and which includes a P+-type diffusion layer (a base of the NPN transistor) as an emitter, an N−-type epitaxial layer (a low concentration collector of the NPN transistor) as a base and a substrate as a collector; and (3) a complementary transistor wherein emitters, bases separately formed through ion implantation masking using a photoresist. With (1) and (2), however, since the gain of the PNP transistor is small, matching in characteristics between the NPN transistor an the PNP transistor is not possible. With (3), it involves the problem that as a photoetching step increases, the productivity (yield, throughput) is lowered, thus impeding realization of highspeed high integration LSIs of the analog digital hybrid type.

In the fields of semiconductor integrated circuit devices requiring the high speed high integration. Consideration is generally given to MOS devices. Because of the fineness of the element, the device not only improves the scale of the integration, but also can reduce the speed-power product according to the scaling rule. The improvement of the integration scale brings about an effect of reducing the delay of interconnection accompanied by the shortage of critical path of the interconnection within integrated circuits, thus leading not only to the high operating speed of the element, but also to an improvement in the operating speed of the integrated circuit as a whole.

Since such high speed and high integration brings about the miniaturization and high performance of the devices in the applied fields, lower consumption power becomes important. As a consequence, the main current of MOS devices are now being changed to CMOS (complementary MOS) devices.

However, recent approaches to scaling down of the MOS devices depend on the photoetching technique and particulary, on the exposure technique. As a pattern size comes close to a wavelength of exposure light, studies have been made on utilization of light with a shorter wavelength (Deep-UV coherent light, X-rays) and charged particles (EB: electron beam, FIB: focussed ion beam). However, the utilization of such light rays inevitably need a large-sized (high cost) exposure apparatus and lowers productivity (throughput), making the practical utility difficult and thus producing an obstacle on the scaling down.

As a measure for solving the above problem, the present applicant disclosed a technique in a previous patent application, which is now described hereinbelow. FIGS. 2 are sectional views of steps of the technique and the steps are illustrated one by one.

(a) First, boron and arsenic are diffused in a P-type silicon substrate 201 having a crystal plane of 111 to form a P+-type diffusion layer 202 with 800–1000Ω/□ and an N+ diffusion layer 203 with 20–30Ω/□. Thereafter, an N− epitaxial layer 203 with 5–10Ω/□ is grown in a thickness of about 0.8 μm. The silicon substrate is oxidized to form an about 500 angstrom thick oxide film (not shown), on which an about 2000 angstrom thick nitride film (not shown) is deposited. The nitride film on the oxide film in a region on which an isolation oxide film is to be formed is removed, and the silicon substrate at the region is etched to a depth of about 4000 angstroms. Using a known high pressure oxidation technique, an about 1 μm thick isolation oxide film 205 is formed. The nitride film is completely removed by etching with phosphoric acid. Thereafter, boron is ion implanted at a dose of $1-5\times10^{15}$ ions/cm$^2$ at an energy of 100 KeV, followed by thermal treatment at 1200° C. to form a P well layer 222. After removal of the about 500 angstrom thick oxide film, a first polysilicon 206 having a thickness of about 3000 angstroms is deposited. The thermal oxidation at 900° C. causes the surface of the polysilicon 206 to be converted to an about 200 angstrom thick oxide film 207. An about 500 angstrom thick nitride film 208 is deposited on the oxide film, followed by using a known lithographic technique to remove the nitride film 208 in regions for separation of electrodes and for a gate of the transistor.

(b) The polysilicon 206 which has not been covered with the nitride film 208 is thermally oxidized according to a known high pressure oxidation technique for conversion into an about 8000 angstrom thick oxide film 209. By utilizing a photoresist, arsenic is ion implanted into polysilicon 210 used as an N channel transistor electrode under conditions of 150 KeV and $1-5\times10^{15}$ ions/cm$^2$ and boron is ion implanted into polysilicon 211 used as a P channel transistor electrode under conditions of 100 KeV and $1-5\times10^{15}$ ions/cm$^2$. In order not to implant unnecessary ions, care should be taken such that when arsenic is ion implanted, the polysilicon 211 is covered with a photoresist and when boron is ion implanted, the polysilicon 210 is covered with a photoresist.

(c) The oxide film 209 which separates the N channel transistor electrode 210 and the P channel transistor electrode 211 therewith is covered with a photoresist, followed by removal of the other thick polysilicon oxide films by the use of hydrofluoric acid. After removal of the photoresist, thermal oxidation at 800° C. is performed to form an about 200 angstrom thick oxide film 216. The regions on which the P channel transistor and the N channel transistor are to be formed are alternately covered with photoresists, followed by ion implantation of boron and arsenic successively under conditions of 40 KeV and $0.5-1 \times 10^{12}$ ions/cm$^2$. Annealing in an atmosphere of N$_2$ at 800°-900° C. allows formation by diffusion of source and drain regions 212 and a channel region 213 of the N channel transistor, source and drain regions 214 and a channel region 215 of the P channel transistor.

(d) Using a known LPCVD technique, an about 1000 angstrom thick oxide film 217 is grown up, followed by growth of second polysilicon 218 with a thickness of about 2000 angstroms by the same method as indicated above.

(e) A gas mainly composed of CF$_4$ is used for anisotropic etching of the second polysilicon 218 and the oxide films 217, 216 according to a known reactive-ion-etching method wherein the nitride film 208 and the single crystal silicon of the substrate serve as a stopper for the etching, thereby obtaining a configuration shown in the sectional view of this figure.

(f) By thermal oxidation at 800° C., an about 150 angstrom thick gate oxide film is formed along with the second polysilicon 218 at the side walls being oxidized. Third polysilicon 220 is subjected to LPCVD in a thickness of about 3000 angstroms. The polysilicon in the P channel transistor region is covered with a photoresist, under which arsenic is ion implanted. The ion implantation conditions include 40 KeV and $1 \times 10^{16}$ ions/cm$^2$. Similarly, a photoresist is used to cover the polysilicon in the N-channel transistor region, under which boron is ion implanted under conditions of 40 KeV and $1 \times 10^{16}$ ion/cm$^2$. According to a known lithographic technique, the third polysilicon 220 and the nitride film 208 are patterned by dry etching. After annealing at 900° C., an about 1500 angstrom thick oxide film is deposited according to LPCVD method. Openings are formed in part of the oxide film 221 on the third polysilicon 220 and the oxide films 221, 216 on the transistor electrodes 210, 211 according to a known lithographic technique, followed by sputtering of an aluminum-silicon alloy (not shown). Moreover, according to a known lithographic technique, the aluminum-silicon alloy is patterned and finally thermally treated at 500° C. in an atomosphere of H$_2$.

Features of the above technique reside in that the gate, source and drain regions are self-alignedly determined and that side walls are formed within the region where the selective oxide film of the polysilicon is removed, whereby a gate which is shorter in size than a minimum dimension of design can be formed.

In the above technique, however, when impurities are incorporated in the polysilicon serving as the source and drain electrodes and diffusion source, it is necessary to provide a masking for ion implantation such as by photolithography with respect to the N channel MOSFET and the P channel MOSFET. This presents a problem on the lowering of productivity (yield, throughput) owing to the repetition of the photolithography procedure.

In addition, since any substrate (well) contact for giving a substrate (well) potential is not provided, limitation is placed on the range of application.

Further, since the electrodes of the gate, source and drain are formed of the polysilicon, a great resistance results. Accordingly, a great drop of voltage takes place owing to the passage of a great current at the time of switching, thus impeding an effect of improving the switching speed by the reduction in length of the gate.

The present invention has been accomplished in order to solve the above problems and has for its object the provision of a method for fabricating in high productivity (1) complementary bipolar transistors applicable to analog digital hybrid-type high speed integration LSIs and (2) complementary MOS transistors applicable to high speed high integration LSIs while removing the production and performance problems with respect to the formation method and structure of source drain electrodes.

DISCLOSURE OF THE INVENTION

According to first and second inventions, selective ion implantation in the respective electrodes of polysilicon is performed by utilizing a low temperature accelerated oxidation phenomenon of polysilicon having a high impurity concentration and the dependence of a projection range of impurities in the ion implantation on an acceleration energy, so that it is not necessary to form a mask resist pattern by photolithography whenever impurities are incorporated.

According to the first invention, a base electrode of polysilicon is defined by selective oxidation and a portion of the oxide film which is a region where intrinsic base and emitter are to be formed is removed, followed by formation of an intrinsic base in the removed region and further formation of a side wall spacer on the inner surface of the removed region to reduce the emitter and form an opening. An extrinsic base is formed by diffusion of an impurity from the base electrode polysilicon. Accordingly, the emitter, intrinsic base and extrinsic base are self-alignedly formed, ensuring the width of the emitter and the distance between the emitter the inactive base which are smaller than the minimum sizes of design.

Moreover, because both NPN transistor and PNP transistor can be formed as having similar vertical structures, there can be fabricated a coplementary bipolar transistor having very uniform characteristics and a high gain.

According to the second invention, a well contact region is recessed so that a well contact electrode of polysilicon is buried. Accordingly, high temperature long term thermal treatment for formation of the well contact becomes unnecessary. As a result, it can be suppressed that the buried layer with a high concentration is diffused upwardly, from which it will be expected to improve a high speed performance owing to the shallow junction.

The source and drain electrodes of polysilicon can be defined by selective oxidation and a portion of the oxide film which is a region where a gate is to be formed is removed. A side wall spacer is formed in the inner surface of the removed region to form the gate as reduced, so that the length of the gate can be made smaller than a minimum size of design.

Because the source and drain are formed through diffusion of impurities from the source and drain electrodes of polysilicon, the impurities are subject to the Gauss distribution where the concentration becomes lower in the vicinity of the gate. Thus, a similar effect to the LDD structure can be obtained with respect to the short channel effect.

In addition, because the polysilicon surfaces of the gate, source and drain electrodes are made low in resistance by formation of a metal silicide, any drop of voltage does not take place against a transit current at the time of switching and, thus, it becomes possible to attain high speed and high integration circuits by fineness according to the scaling rule.

BRIEF DESCRIPTION OF THE DRAWINGS

FIGS. 4(A)–(F) are sectional views of known steps in connection with the first invention;

FIGS. 1(A)–(L) are a process chart, in section, of an embodiment of a second invention.

BEST MODE FOR CARRYING OUT THE INVENTION

Figure 1A:
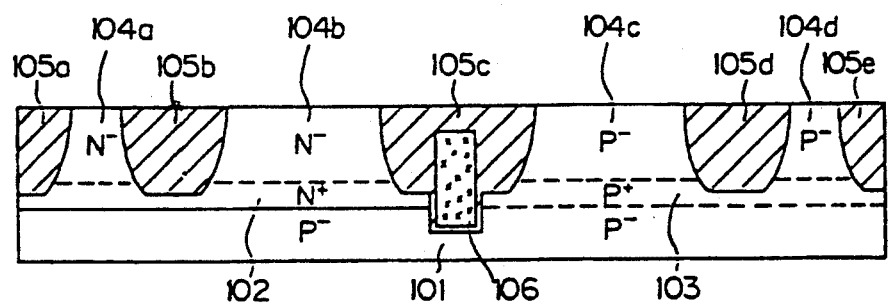

The first embodiment of the first invention is described with reference to the drawings. FIGS. 3(A)–(L) are a process chart, in section, of the first embodiment of the first invention.

First, according to a known technique, an $N^+$-type buried layer 302 and a $P^{+2}$-type buried layer 303, each having an impurity concentration of $10^{18}$–$10^{21}$ cm$^{-3}$, are formed on a $P^-$-type silicon substrate 301. After growth of an epitaxial layer 304 having a thickness of 0.5–1.5 μm, element isolation and formation of a well layer are performed to form collector sink regions 304a, 304d and active transistor regions 304b, 304c having an impurity concentration of $10^{15}$–$10^{17}$ cm$^{-3}$. (Where importance is placed on the high speed performance of the transistor, it is preferred as in this embodiment to provide 0.3–1.3 μm thick oxide films 305b, 305d between the collector sinks, active transistor, and 0.3–1.3 μm thick oxide films 305a, 305c, 305e and a 3–5 μm thick isolation groove 306 (trench) between transistor and transistor.) [FIG. 3(A)]

Next, a 2000–5000 angstrom thick polysilicon film 307, a 100–1000 angstrom thick pad oxide film (not shown) and a 500–2000 angstrom thick silicon nitride film 208 are successively formed over the entire surface, followed by photoetching of the silicon nitride film 308 for division into collector electrode patterns 308a, 308d and base electrode patterns 308b, 308c. Thereafter, thermal oxidation is performed to form collector electrodes 307a, 307d of polysilicon and base electrodes 307b, 307c of polysilicon separated with oxide films 309a, 309b, 309c. [FIG. 3(B)]

Subsequently, photoetching of the nitride film and ion implantation are performed on the collector sink regions of the NPN and PNP transistors, respectively, followed by thermal treatment in a non-oxidative atmosphere to form collector sinks 304a', 304d' with an impurity concentration if $10^{18}$–$10^{21}$ cm$^{-3}$. (With respect to the NPN transistor, the nitride film 308a is etched and phosphorus is ion implanted at approximately $10^{15}$–$10^{17}$ cm$^{-2}$ and with respect to the PNP transistor, the nitride film 308d is etched, after which boron is ion implanted at approximately $10^{15}$–$10^{17}$ cm$^{-2}$.) [FIG. 3(C)]

Photoetching and ion implantation are performed on intrinsic base and emitter forming regions of the respective NPN and PNP transistors, which are subjected to thermal treatment in a non-oxidative atmosphere to form intrinsic bases 311a, 311b with an impurity concentration of $10^{16}$–$10^{18}$ cm$^{-2}$. (With respect to the NPN transistor, the oxide film 309b is etched and boron is ion implanted at approximately $10^{12}$–$10^{14}$ cm$^{-2}$ while leaving a photoresist, and with respect the PNP transistor, while a photoresist used to etch the oxide film 309c is left, phosphorus is ion implanted at approximately $10^{12}$–$10^{14}$ cm$^{-2}$.) [FIG. 3(D)] It will be noted that etching of the oxide films 309b, 309c easily proceeds when buffered hydrofluoric acid is used. This is because the single crystal silicon 304b, 304c, polysilicon 307b, 307c and the nitride films 308b, 308c can be used as an etching stopper.

Figure 3A:
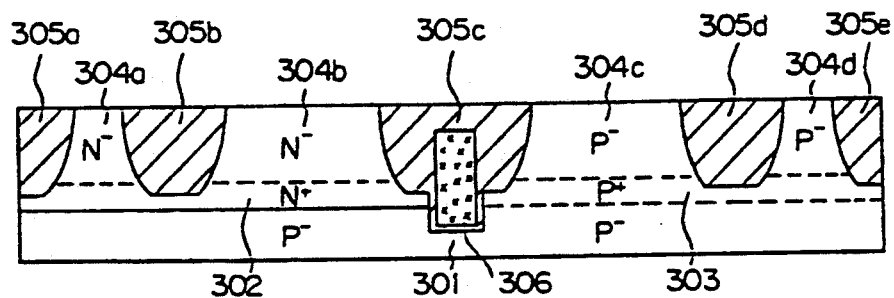
FIGS. 3(A)–(L) are a process chart, in section, of a first embodiment of a first invention.
Figure 3B:
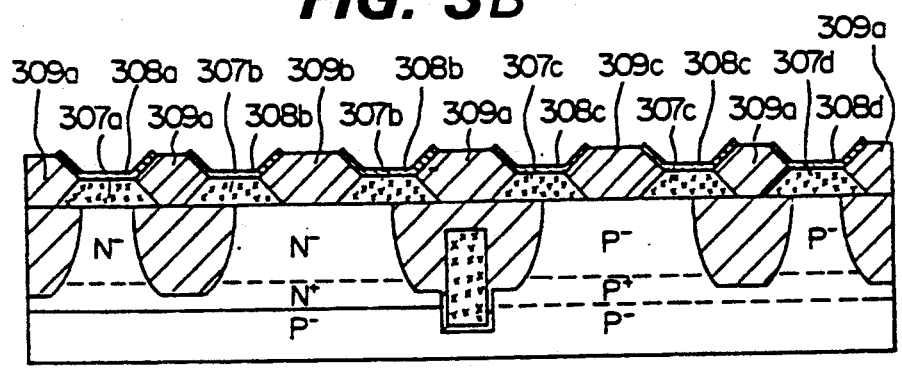
Figure 3C:
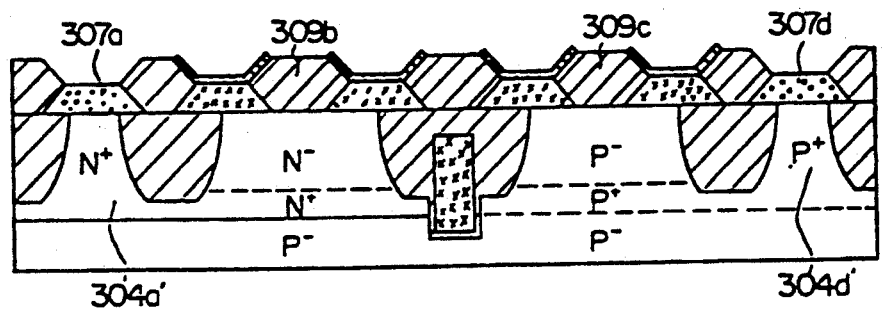
Figure 3D:
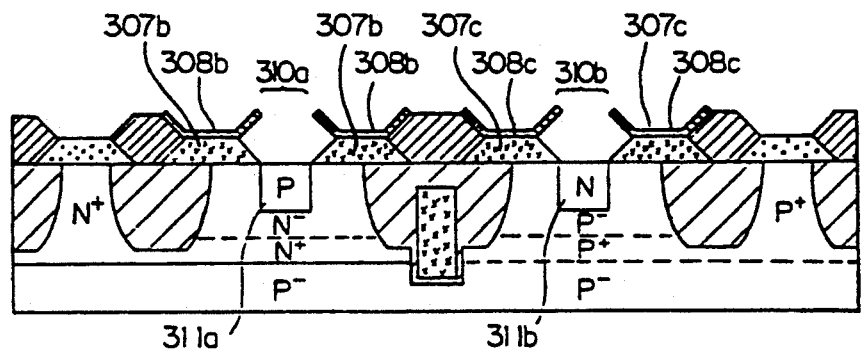
Figure 3E:
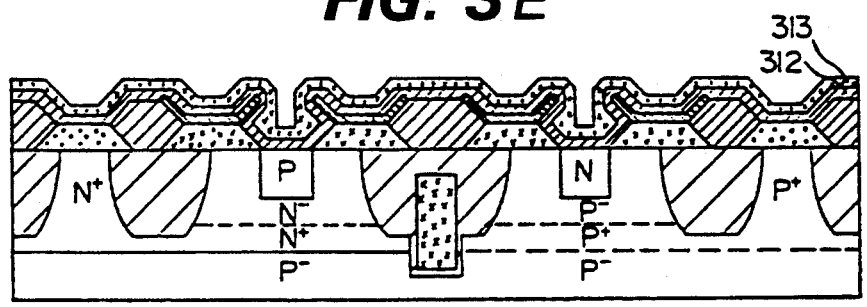
Figure 3F:
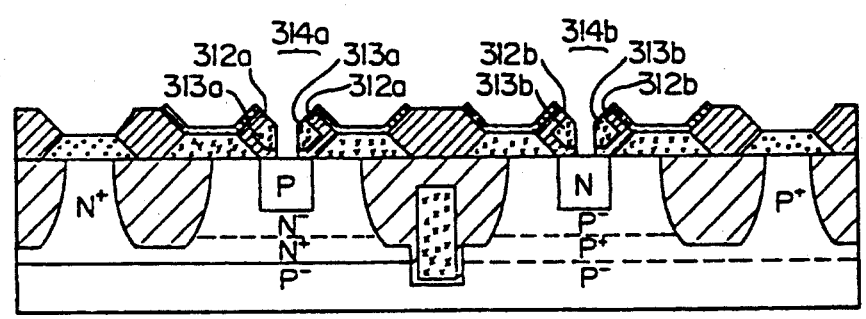

A 1000–3000 angstrom thick silicon oxide film 312 and a 1000–5000 angstrom thick polysilicon film 313 are successively deposited over the entire surface according to a LPCVD technique [FIG. 3(E)], and are etched back by anisotropic etching to form oxide films 312a, 312b and polysilicon 313a, 313b on the inner side walls of openings 310a, 310b, respectively. As a result, emitter diffusion windows 314a, 314b are reduced in size and opened self-alignedly with respect to the openings 310a, 310b. [FIG. 3(F)]

Figure 3G:
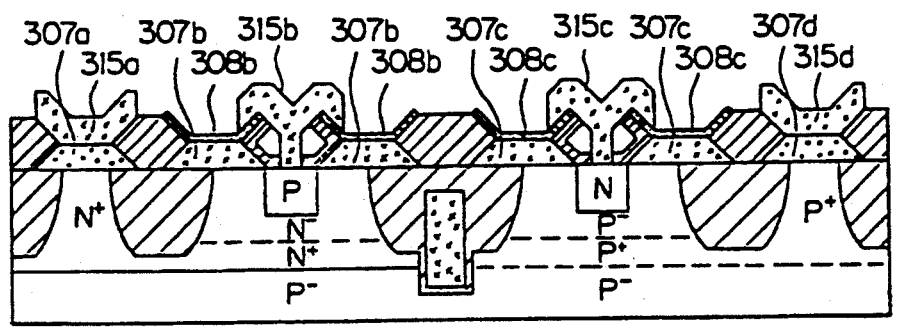

Next, 3000–5000 angstrom thick polysilicon 315 is deposited over the entire surface according to a LPCVD method, followed by photoetching to form collector electrodes 315a, 315d of polysilicon and emitter electrodes 315b, 315c of polysilicon. [FIG. 3(G)]

Figure 3H:
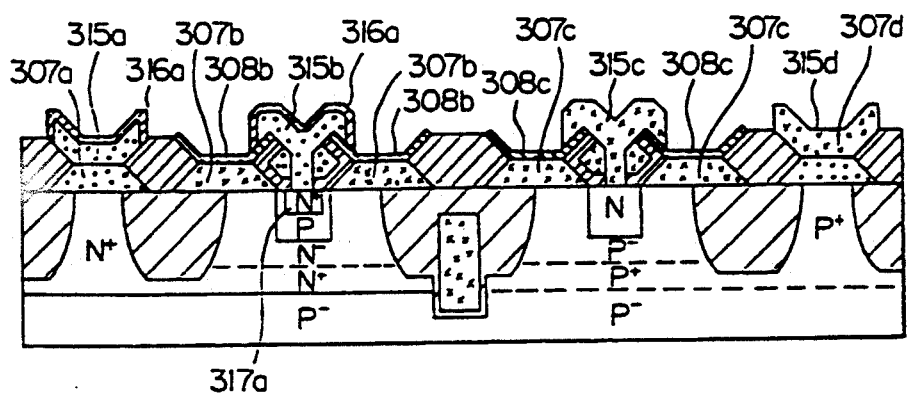

A second transistor region is covered, for example, with a photoresist, and ion implanted with phosphorus or arsenic at approximately $10^{15}$–$10^{16}$ cm$^{-2}$, followed by thermal treatment in a non-oxidative atmosphere and low temperature thermal oxidation, thereby selectively forming 1000–2000 angstrom thick oxide films 316a, 316b on the polysilicon surfaces of the collector and emitter electrodes of the first transistor by the use of a low temperature accelerated oxidation phenomenon in the polysilicon with a high impurity concentration, along with an emitter 317a. [FIG. 3(H)]

Figure 3I:
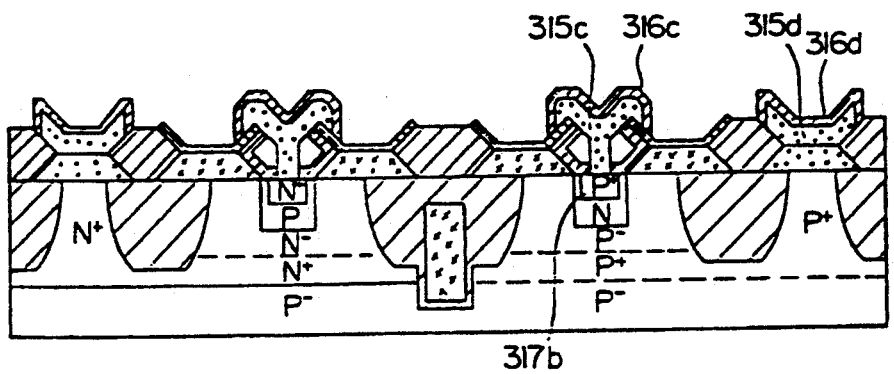

Boron is then ion implanted over the entire surface at approximately $10^{15}$–$10^{16}$ cm$^{-2}$ and subjected to thermal treatment in a non-oxidative atmosphere and low temperature thermal oxidation to utilize the low temperature accelerated oxidation phenomenon, thereby selectively forming 1000–3000 angstrom thick oxide films 316c, 316d on the polysilicon surfaces of the collector and emitter electrodes of the second transistor, along with an emitter 317b. [FIG. 3(I)] It will be noted that when the ion implantation of boron is performed at an acceleration energy of about 20–30 KeV, the ions can be selectively implanted into the respective polysilicon electrodes of the collector and emitter of the first transistor without masking, for example, with a photoresist.

Figure 3J:
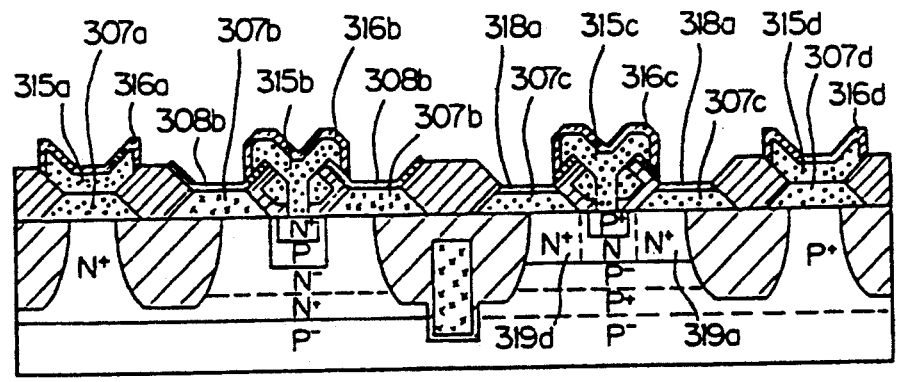

Subsequently, the first transistor region is covered with a photoresist, not shown, and the nitride film 308c is removed, and phosphorus or arsenic is ion implanted at approximately $10^{14}$–$10^{16}$ cm$^{-2}$, followed by subjecting to thermal treatment in a non-oxidative atmosphere and low temperature thermal oxidation so that the above-stated low temperature accelerated oxidation phenomenon is used to selectively form a 1000–2000 angstrom thick oxide film 318a on the surface of the base electrode polysilicon 307c of the second transistor and also to form an extrinsic base 319a. [FIG. 3(J)]

Figure 3K:
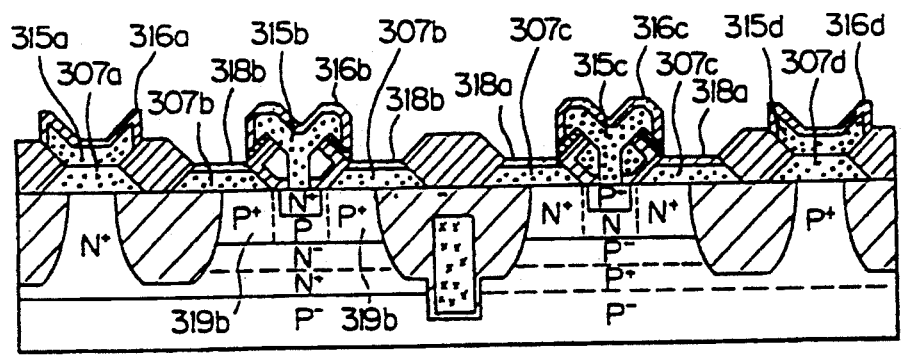

The nitride film 308b is then removed and boron is ion implanted at approximately $10^{14}$–$10^{16}$ cm$^{-2}$, followed by subjecting to thermal treatment in a non-oxidative atmosphere and low temperature thermal oxidation so that the above-stated low temperature accelerated oxidation phenomenon is used to selectively form a 1000–2000 angstrom thick oxide film 318b on the surface of the base electrode polysilicon 307c of the first transistor and also to form an extrinsic base 319a. FIG. 3(k) It will be noted that the ion implantation of boron is effected at an acceleration energy of 20–30 keV, the ions can be selectively implanted into the base electrode polysilicon of the first transistor without masking such as with a photoresist.

Figure 3L:
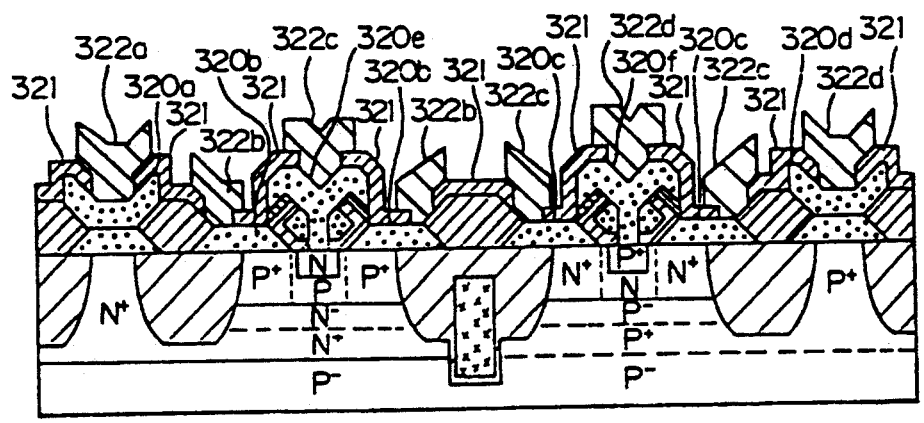
Figure 4A:
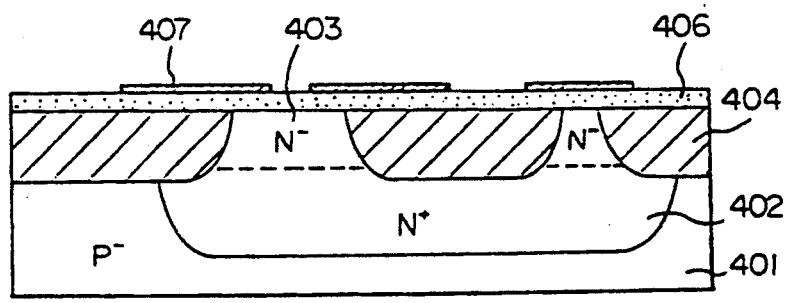
Figure 4B:
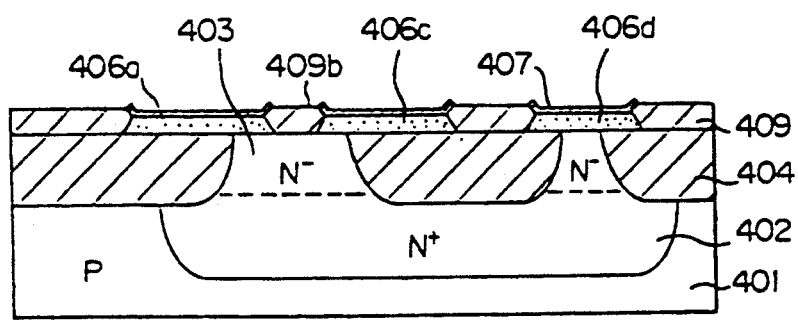
Figure 4C:
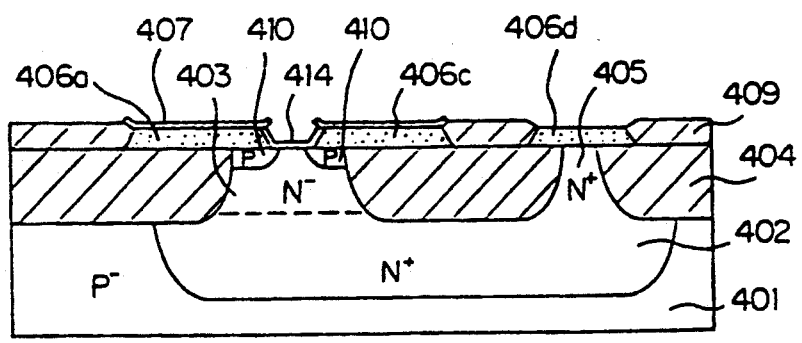
Figure 5A:
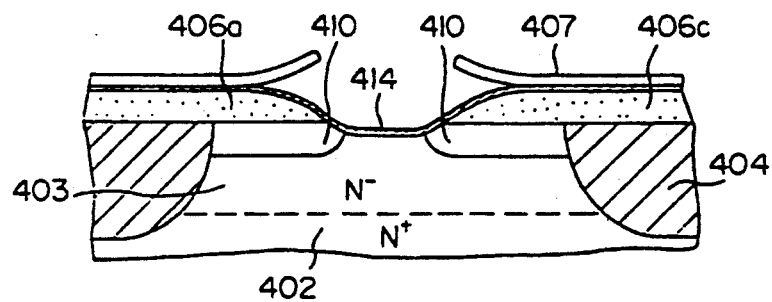
FIGS. 5(a)–(f) are views illustrating in more detail the steps in FIGS. 4(C)–(F), respectively.
Figure 5B:
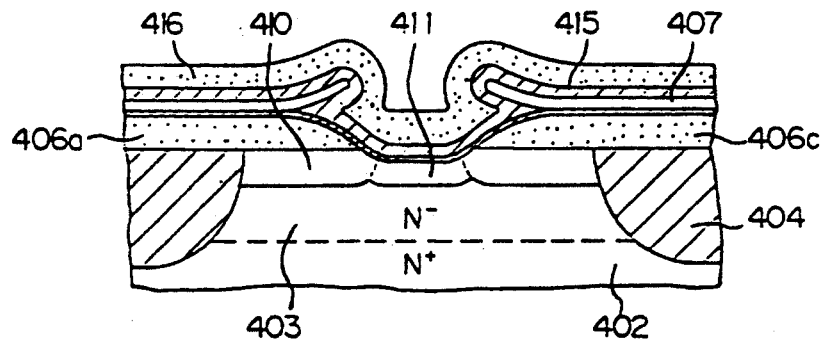
Figure 5C:
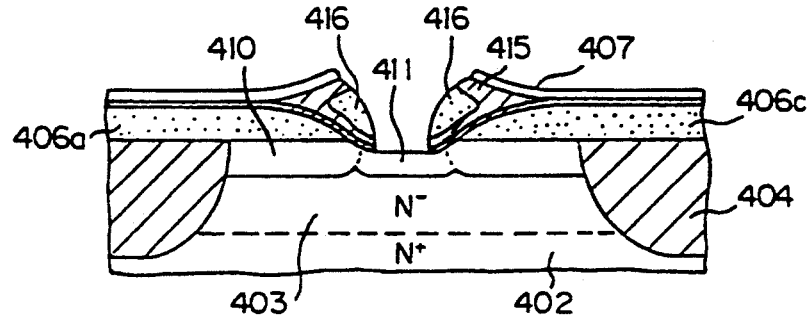
Figure 5D:
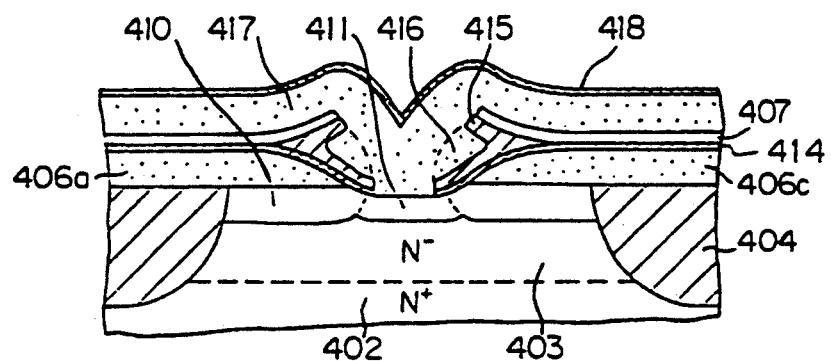
Figure 5E:
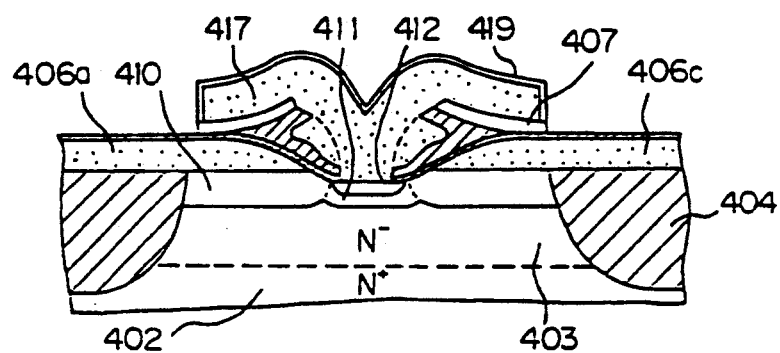
Figure 5F:
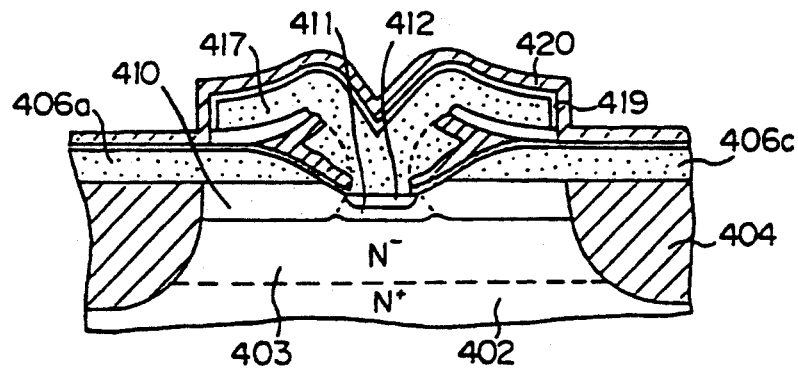

Finally, the oxide films 316a, 316b, 316c, 316d, 318a and 318b on the surfaces of the respective polysilicon electrodes 315a, 315b, 315c, 316d, 307b and 307c are washed out with buffered hydrofluoric acid and the resultant exposed surfaces of the polysilicon electrodes are formed with metal salicides (self-aligned silicide) 320a, 320b, 320c and 320d, followed by deposition of an insulating film 321 by the use of a LPCVD method, formation of contacts by photoetching and formatin of metal interconnections 322a, 322b, 322c and 322d, respectively. [FIG. 3(L)]

The second embodiment of the first invention is described with reference to the drawings.

FIGS. 6(A)–(L) are a process chart in section of the second embodiment of the first invention.

First, according to a known technique, an N$^+$-type buried layer 302 and a P$^+$-type buried layer 303, each having an impurity concentration of $10^{18}$–$10^{21}$ cm$^{-3}$, are formed on a P$^-$-type silicon substrate 301. After growth of an epitaxial layer 304 having a thickness of 0.5–1.5 μm, element separation and formation of a well layer are performed to form collector sink regions 304a, 304d and active transistor regions 304b, 304c having an impurity concentration of $10^{15}$–$10^{17}$ cm$^{-3}$. (Where importance is placed on the high speed performance of the transistor, it is preferred as in this embodiment to provide 0.3–1.3 μm thick oxide films 305b, 305d between the collector sinks active transistor, and 0.3–1.3 μm thick oxide films 305a, 305c, 305e and a 3–5 μm thick separation groove 306 (trench) between transistor transistor.) [FIG. 6(A)]

Figure 6A:
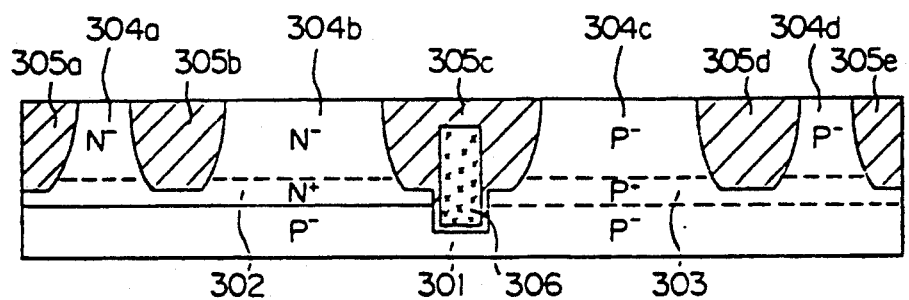
FIGS. 6(A)–(L) are a process chart, in section, of a second embodiment of the first invention.
Figure 6B:
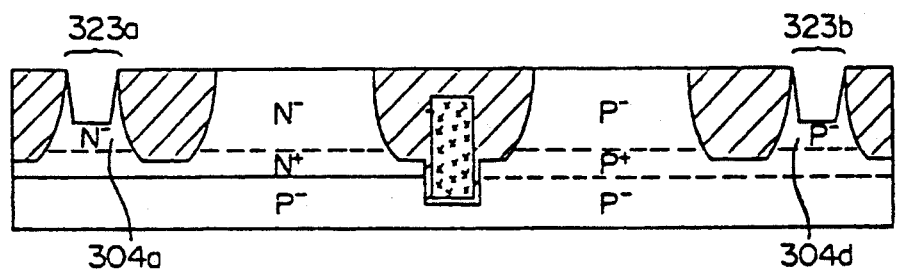
Figure 6C:
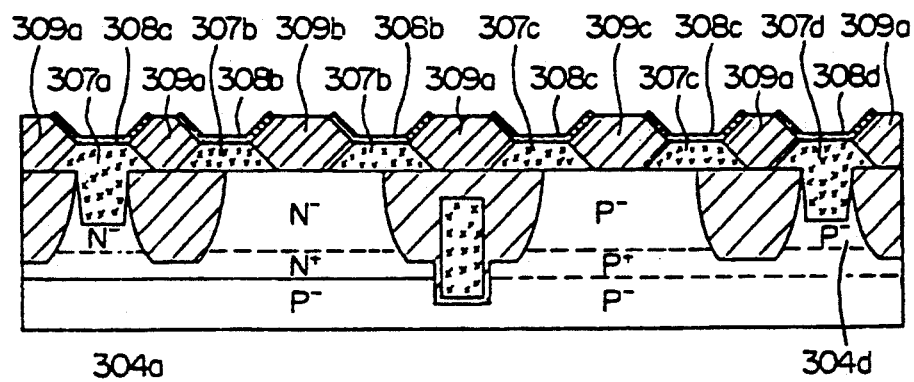
Figure 6D:
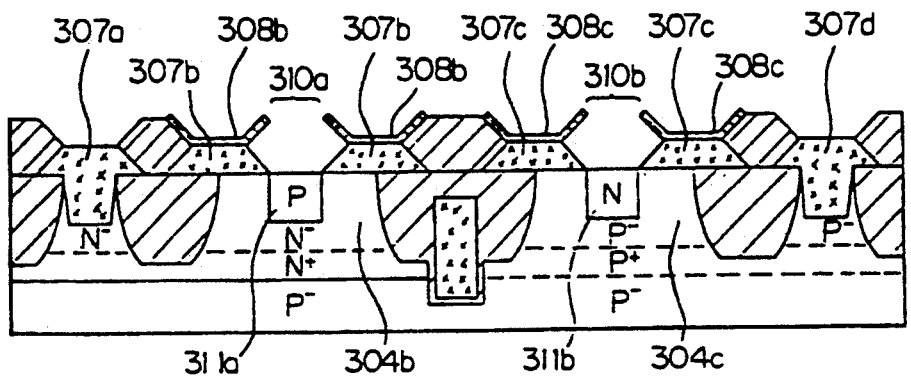

Next, using photoetching, the silicon layers of the collector sink regions 304a, 304b are etched to form collector recesses 323a, 323b. [FIG. 6(B)]

Then, a 2000–5000 angstrom thick polysilicon film 307, a 100–1000 angstrom thick pad oxide film (not shown) and a 500–2000 angstrom thick silicon nitride film 208 are successively formed over the entire surface, followed by photoetching of the silicon nitride film 308 for division into collector patterns 308a, 308d and base electrode patterns 308b, 308c. Thereafter, thermal oxidation is performed to form collector electrodes 307a, 307d of polysilicon and base electrodes 307b, 307c of polysilicon separated with oxide films 309a, 309b, 309c. Photoetching is used to remove the nitride films 308a, 308d on the collector electrodes 307a, 307d of polysilicon. [FIG. 6(C)]

Photoetching and ion implantation are performed on intrinsic base and emitter forming regions of the NPN and PNP transistors, respectively, which are then subjected to thermal treatment in a non-oxidative atmosphere to form intrinsic bases 311a, 311b with an impurity concentration of $10^{16}$–$10^{18}$ cm$^{-2}$. (With respect to the NPN transistor, the oxide film 309b is etched and boron is ion implanted at approximately $10^{12}$–$10^{14}$ cm$^{-2}$ while leaving a photoresist, and with respect to the PNP transistor, while a photoresist used to etch the oxide film 309c is left, phosphorus is ion implanted at approximately $10^{12}$–$10^{14}$ cm$^{-2}$.) [FIG. 6(D)] It will be noted that etching of the oxide films 309b, 309c easily proceeds when buffered hydrofluoric acid is used. This is because the single crystal silicon 304b, 304c, polysilicon 307b, 307c and the nitride films 308b, 308c can be used as an etching stopper.

Figure 6E:
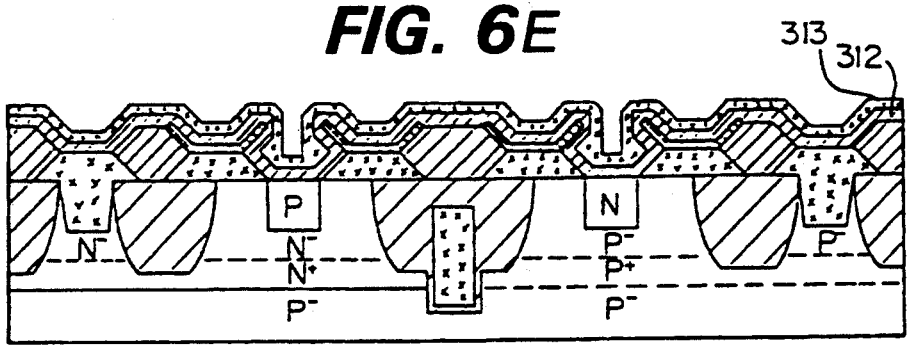
Figure 6F:
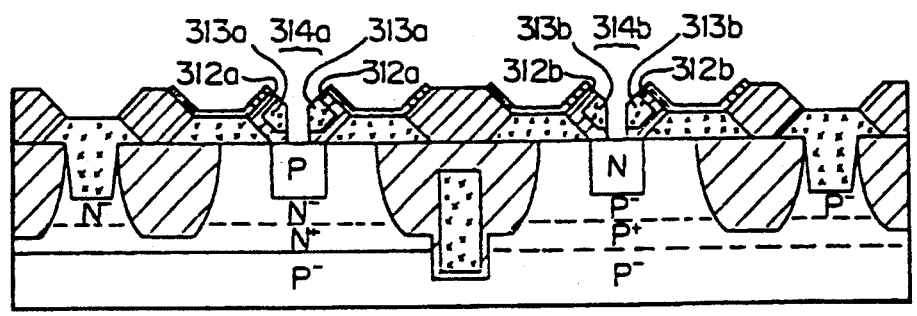

A 1000–3000 angstrom thick silicon oxide film 312 and a 1000–5000 angstrom thick polysilicon film 313 are successively deposited over the entire surface according to a LPCVD technique [FIG. 6(E)], and are etched back by anisotropic etching to form oxide films 312a, 312b and polysilicon 313a, 313b on the inner side walls of opening 310a, 310b, respectively. As a result, emitter diffusion windows 314a, 314b are reduced in size and opened self-alignedly with respect to the openings 310a, 310b. [FIG. 6(F)]

Figure 6G:
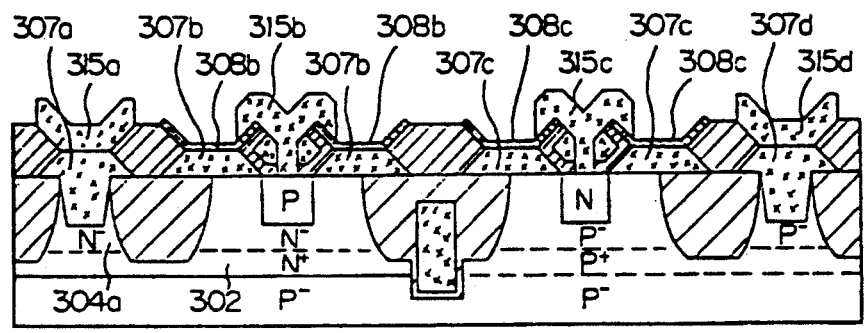

Next, 3000–5000 angstrom thick polysilicon 315 is deposited over the entire surface according to a LPCD method, followed by photoetching to form collector electrodes 315a, 315d of polysilicon and omitter electrodes 315b, 315c of polysilicon. [FIG. 6(G)]

Figure 6H:
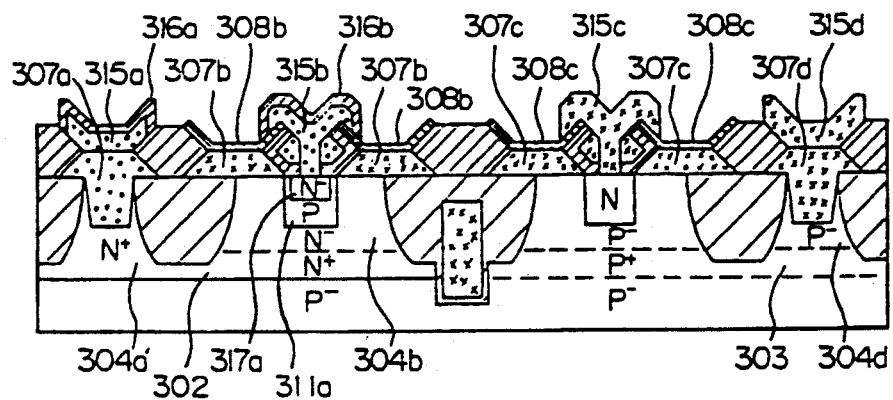

A second transistor region is covered, for example, with a photoresist, and ion implanted with phosphorus or arsenic at approximately $10^{15}$–$10^{16}$ cm$^{-2}$, followed by thermal treatment in a non-oxidative atmosphere and low temperature thermal oxidation, thereby selectively forming 1000–2000 angstrom thick oxide films 316a, 316b on the polysilicon surfaces of the collector and emitter electrodes of the first transistor by the use of a low temperature accelerated oxidation phenomenon in the polysilicon with a high impurity concentration, along with an emitter 317a and a collector sink 304a'. [FIG. 6(H)]

Figure 6I:
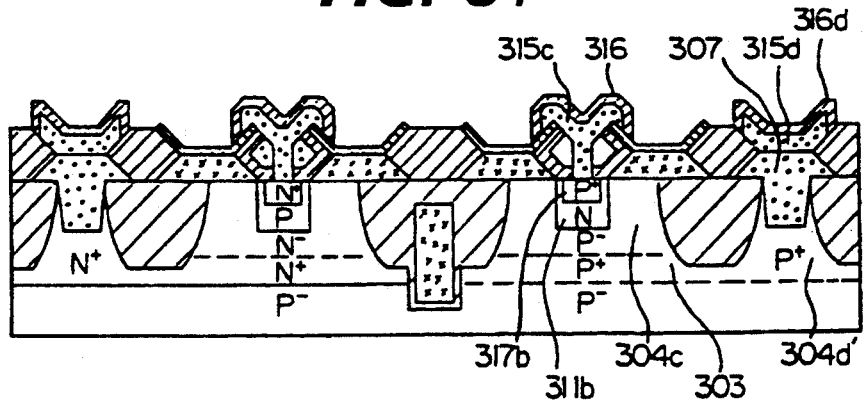

Boron is then ion implanted over the entire surface at approximately $10^{15}$–$10^{16}$ cm$^{-2}$ and subject to thermal treatment in a non-oxidative atmosphere and low temperature thermal oxidation to utilize the temperature accelerated oxidation phenomenon, thereby selectively forming 1000–3000 angstrom thick oxide films 316c, 316d on the polysilicon surfaces of the collector and emitter electrodes of the second transistor, along with an emitter 317b and a collector sink 304d'. [FIG. 6(I)] It will be noted that when the ion implantation of boron is performed at an acceleration energy of about 20–30 keV, the ions can be selectively implanted into the respective polysilicon electrodes of the collector and emitter of the first transistor without masking, for example, with a photoresist.

Figure 6J:
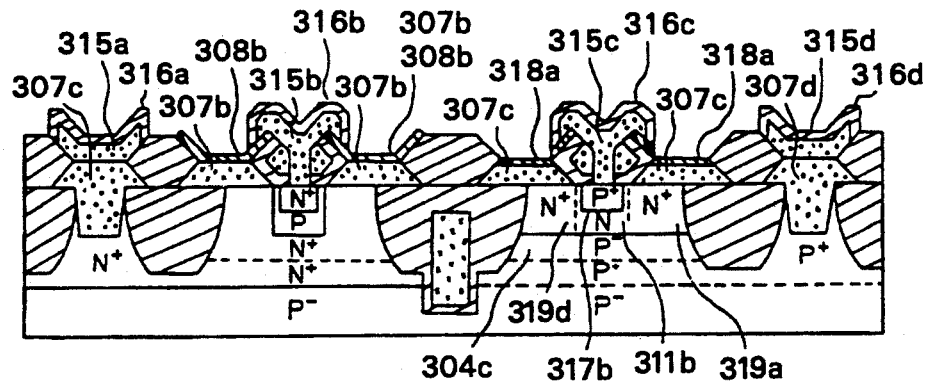

Subsequently, the first transistor region is covered with a photoresist, not shown, and the nitride film 308c is removed, and phosphorus or arsenic is ion implanted at approximately $10^{14}$–$10^{16}$ cm$^{-2}$, followed by subjecting to thermal treatment in a non-oxidative atmosphere and low temperature thermal oxidation so that the above-stated low temperature accelerated oxidation phenomenon is used to selectively form a 1000–2000 angstrom thick oxide film 318a on the surface of the base electrode polysilicon 307c of the second transistor and also to form an inactive base 319a. [FIG. 6(J)]

Figure 6K:
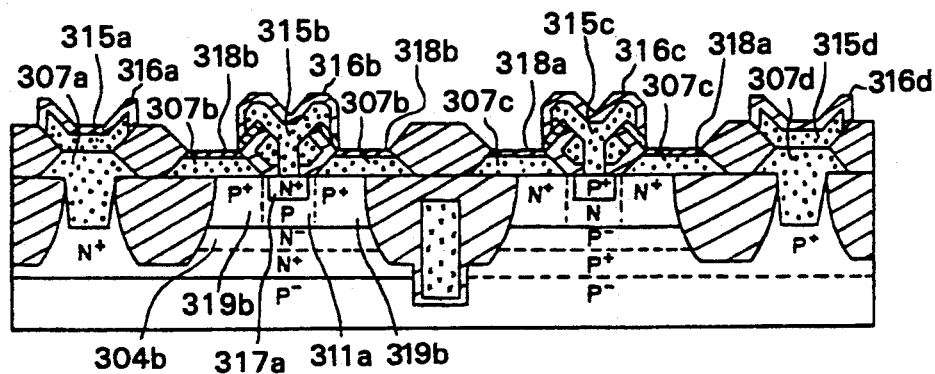

The nitride film 308b is then removed and boron is ion implanted at approximately $10^{14}$–$10^{16}$ cm$^{-2}$, followed by subjecting to thermal treatment in a non-oxidative atmosphere and low temperature thermal oxidation so that the above-stated low temperature accelerated oxidation phenomenon is used to selectively form a 1000-2000 angstrom thick oxide film 318b on the surface of the base electrode polysilicon 307c of the first transistor and also to form an extrinsic base 319a. [FIG. 6(K)] It will be noted that when the ion implantation of boron is effected at an acceleration energy of 20-30 keV, the ions can be selectively implanted into the base electrode polysilicon of the first transistor without coverage such as with a photoresist.

Figure 6L:
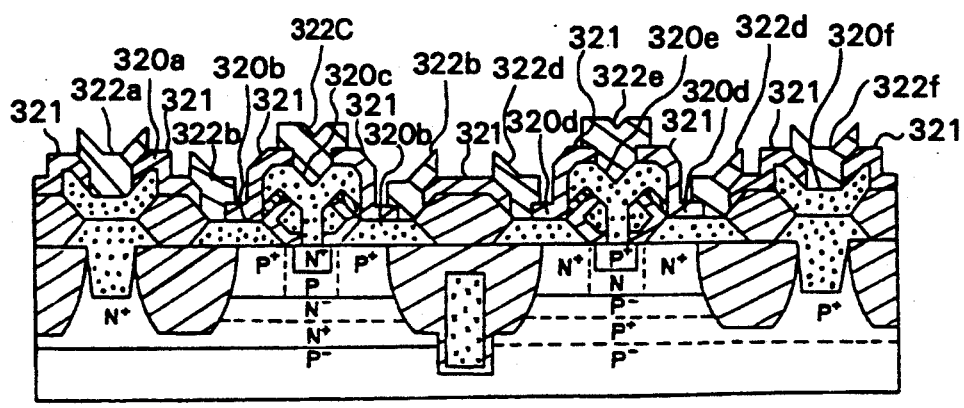

Finally, the oxide films 316a, 316b, 316c, 316d, 318a and 318b on the surfaces of the respective polysilicon electrodes 315a, 315b, 315c, 315d, 307b and 307c are washed out with buffered hydrofluric acid and the resultant exposed surfaces of the polysilicon electrodes are formed with metal salicides (self-aligned silicide), followed by deposition of an insulating film 321, for example, by the use of a LPCD method, formation of contacts by photoetching and formation of metal interconnections 322a-322d, respectively. [FIG. 6(L)]

In this second embodiment, the collector sink regions are recessed and the collector electrodes of polysilicon are arranged to be buried, so that high temperature long-term thermal treatment for the formation of the collector sinks becomes unnecessary. As a result, the upward diffusion of the highly concentrated buried layer can be suppressed along with the expectation that the high speed performance through shallow junction is improved.

The embodiment of the second invention is described with respect to the drawings. FIGS. 1(A)-(L) are a process chart in section of one embodiment of the invention.

According to a known technique, an N+-type buried layer 102 and a P+-type buried layer 103, each having an impurity concentration of $10^{18}$-$10^{21}$ cm$^{-3}$, are formed on a P--type silicon substrate 101. After growth of an epitaxial layer 104 having a thickness of 0.5-1.5 μm, element isolation and formation of a well layer are performed to form well contact regions 104a, 104d and active FET regions 104b, 104c having an impurity concentration of $10^{15}$-$10^{17}$ cm$^{-3}$. (Where importance is placed on a latch-up resistance of FET, it is preferred as in this embodiment to provide 0.3-1.3 μm thick oxide films 105b, 105d between the well contact active FET, and 0.3-1.3 μm thick oxide films 105a, 105c, 105e and a 3-5 m thick seperation groove (trench) 106 between FET FET.) [FIG. 1(A)]

Figure 1B:
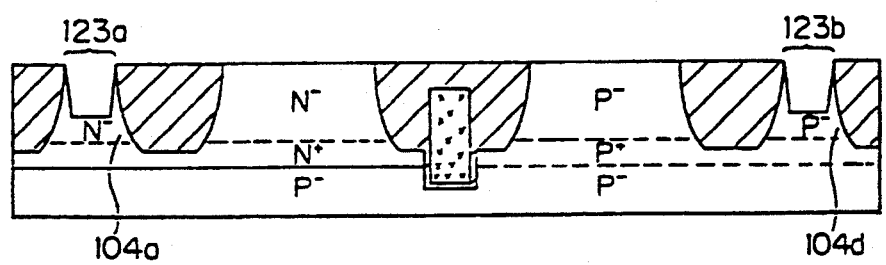
Figure 1C:
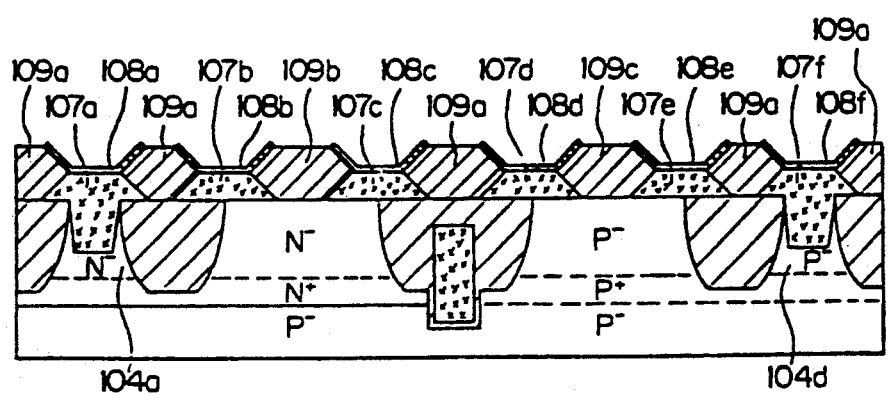

Next, using photoetching, the silicon layers of the well contact regions 104a, 104b are etched to form well contact recesses 123a, 123b. [FIG. 1(B)]

Then, a 2000-5000 angstrom thick polysilicon film 107, a 100-1000 angstrom thick pad oxide film (not shown) and a 500-2000 angstrom thick silicon nitride film 108 are successively formed over the entire surface, followed by photoetching of the silicon nitride film 108 for division into well contact electrode patterns 108a, 108f and source drain electrode patterns 108b, 108c, 108d, 108e. Thereafter, thermal oxidation is performed to form well contact electrodes 107a, 107f of polysilicon and source drain electrodes 107b, 107c, 107d, 107e of polysilicon separated with oxide films 109a, 109b, 109c. [FIG. 1(C)]

Photolithography and ion implantation are performed on gate-forming regions of the respective FETs of NMOS and PMOS, respectively, which are then subjected to thermal treatment in a non-oxidative atmosphere to form channels 111a, 111b with an impurity concentration of $10^{15}$-$10^{17}$ cm$^{-2}$. With respect to the NMOSFET, the oxide film 109b is etched and boron is ion implanted at approximately $10^{11}$-$10^{13}$ cm$^{-2}$ while leaving a photoresist used for the etching. [FIG. 1(D)] It will be noted that etching of the oxide films 109b, 109c easily proceeds when buffered hydrofluoric acid is used. This is because the single crystal silicon 104b, 104c, polysilicon 107b, 107c and the nitride films 108b, 108c, 108d, 108e can be used as an etching stopper.

A 1000-3000 angstrom thick silicon oxide film 112 and a 1000-5000 angstrom thick polysilicon film 113 are successively deposited over the entire surface according to a LPCVD technique [FIG. 1(E)], and are etched back by anisotropic etching to form oxide films 112a, 112b and polysilicon 113a, 113b on the inner side walls of opening 110a, 110b, respectively. As a result, gate regions 114a, 114b are reduced in size and opened self-alignedly with respect to openings 110a,110b. Thereafter, the exposed silicon surfaces are formed with 50-500 angstrom thick gate oxide films 124a, 124b, respectively. [FIG. 1(F)]

Figure 1G:
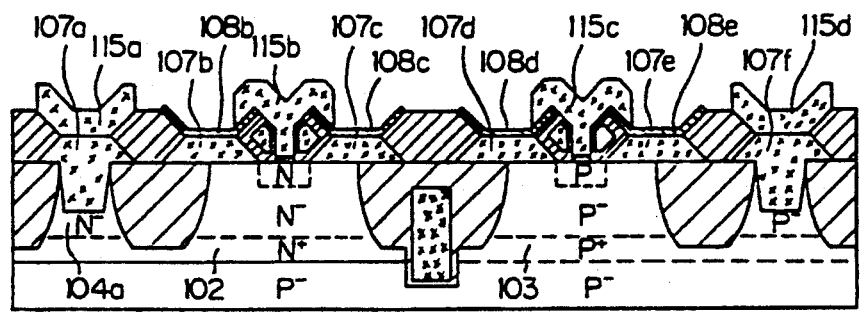

Next, after removal of the nitride films 108a, 108b and the pad oxide film (not shown) left on the well contact electrodes of polysilicon according to photoetching, 3000-5000 angstrom thick polysilicon 115 is depodited over the entire surface according to a LPCVD method, followed by photoetching to form well contact electrodes 115a, 115d of polysilicon and gate electrodes 115b, 115c of polysilicon. [FIG. 1(G)]

Figure 1H:
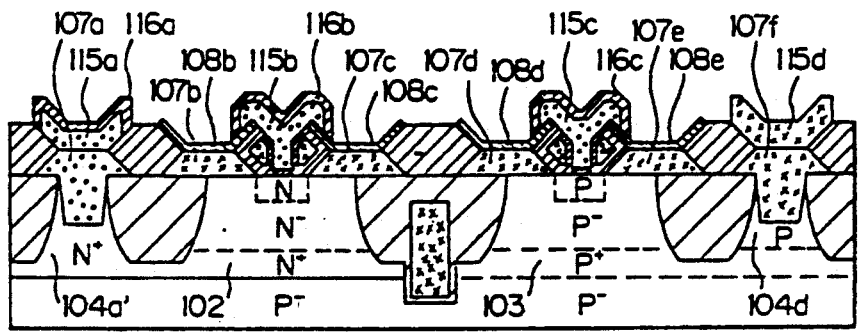

A well contact region of the second FET is covered, for example, with a photoresist, and ion implanted with phosphorus at approximately $10^{15}$-$10^{16}$ cm$^{-2}$, followed by thermal treatment in a non-oxidative atmosphere and low temperature thermal oxidation, thereby selectively forming 1000-2000 angstrom thick oxide films 116a, 116b, 116c on the well contact of the first FET, the polysilicon surface of the gate electrode and the polysilicon surface of the gate electrode of the second FET by the use of a low temperature accelerated oxidation phenomenon in the polysilicon with a high impurity concentration, along with a well contact 104a'. [FIG. 1(H)]

Figure 1I:
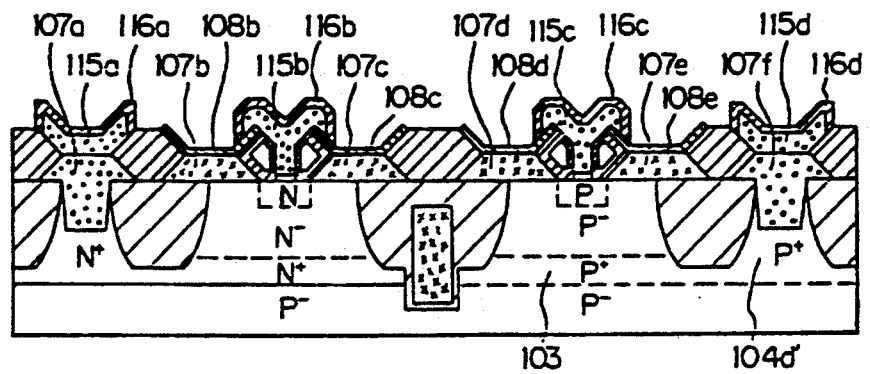

Boron is then ion implanted over the entire surface at approximately $10^{15}$-$10^{16}$ cm$^{-2}$ and subjected to thermal treatment in a non-oxidative atmosphere and low temperature thermal oxidation to utilize the low temperature accelerated oxidation phenomenon, thereby selectively forming a 1000-3000 angstrom thick oxide film 116d on the polysilicon surface of the well contact electrode of the second FET, along with a well contact 104d'. [FIG. 1(I)] It will be noted that when the ion implantation of boron is performed at an acceleration energy of about 20-30 keV, the ions can be selectively implanted into the polysilicon of the well contact electrodes of the second FET without masking, for example, with a photoresist.

Figure 1J:
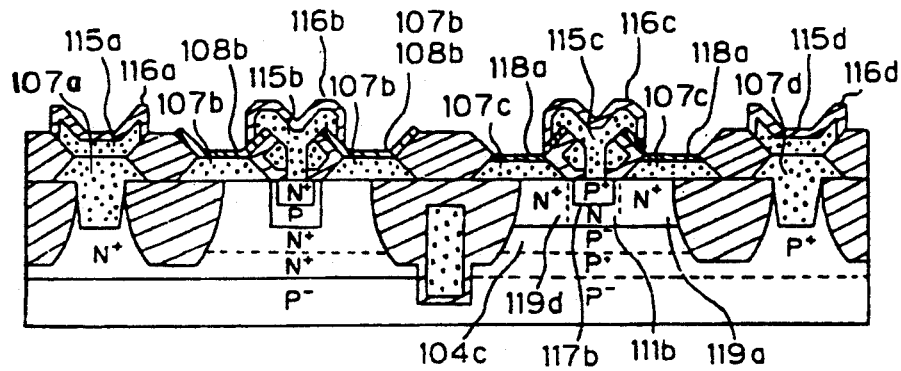

Subsequently, the first FET region is covered with a photoresist, and the nitride films 108d, 108e are removed, and arsenic is ion implanted at approximately $10^{14}$-$10^{16}$ cm$^{-2}$, followed by subjecting to thermal treatment in a non-oxidative atmosphere and low temperature thermal oxidation so that the above-stated low temperature accelerated oxidation phenomenon is used to selectively form 1000-2000 angstrom thick oxide films 118a, 118b on the surfaces of the source and drain electrodes 107d, 107e of polysilicon of the second FET and also to form source drain 119a, 119b. [FIG. 1(J)]

Figure 1K:
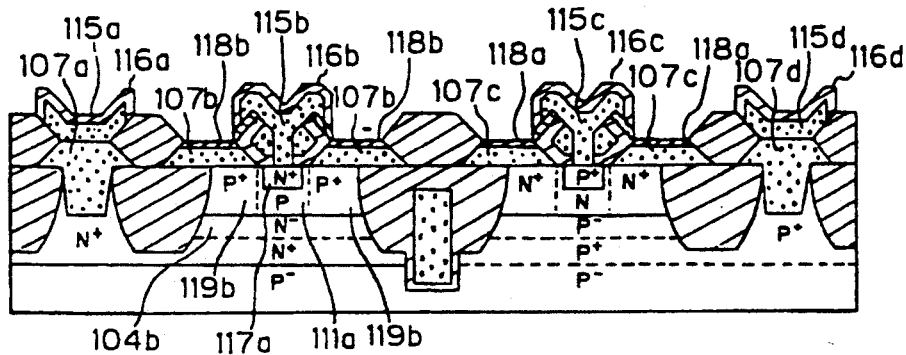

The nitride films 108b, 108c are then removed and boron is ion implanted at approximately $10^{14}$–$10^{16}$ cm$^{-2}$, followed by subjecting to thermal treatment in a non-oxidative atmosphere and low temperature thermal oxidation so that the above-stated low temperature accelerated oxidation phenomenon is used to selectively form 1000-2000 angstrom thick oxide film 118c, 118d on the surfaces of the source and drain electrodes 107b, 107c of polysilicon of the first FET and also to form source drain 119c, 119d. [FIG. 1(K)] It will be noted that when the ion implantation of boron is effected at an acceleration energy of 20-30 keV, the ions can be selectively implanted into the source drain electrodes of polysilicon of the first FET without masking such as with photoresist.

Figure 1L:
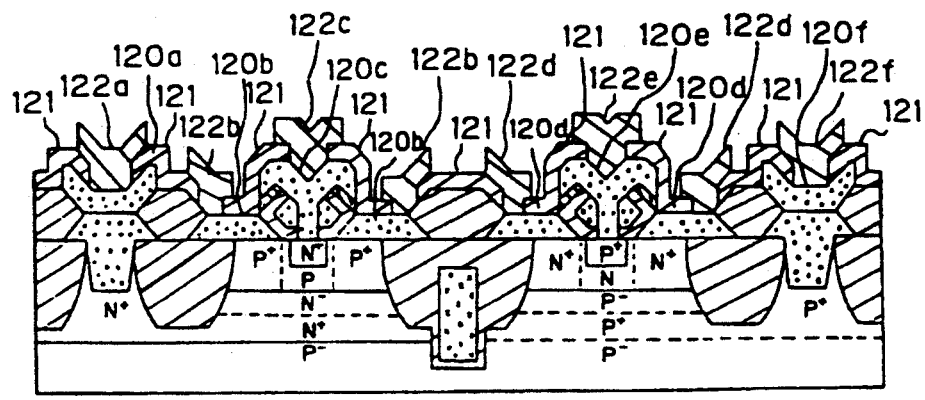
Figure 2A:
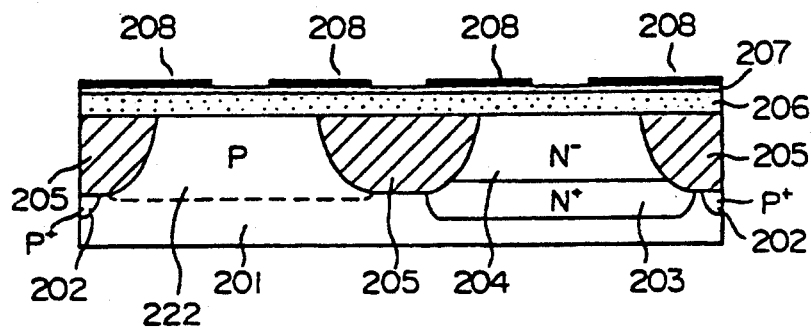
FIGS. 2(a)–(f) are a process chart of a known fabrication method in connection with the second invention.
Figure 2B:
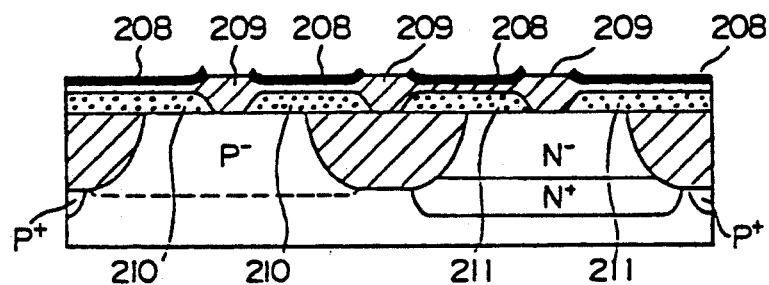
Figure 2C:
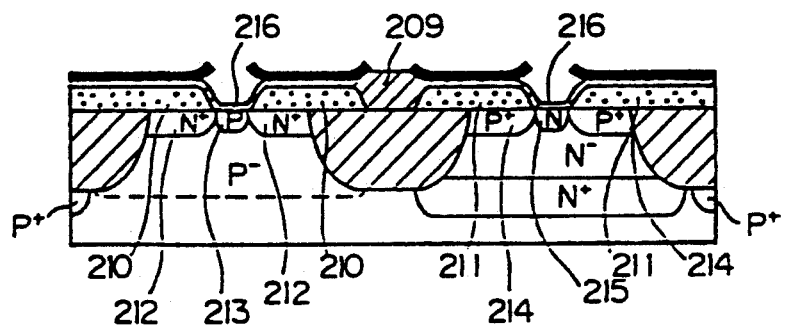
Figure 2D:
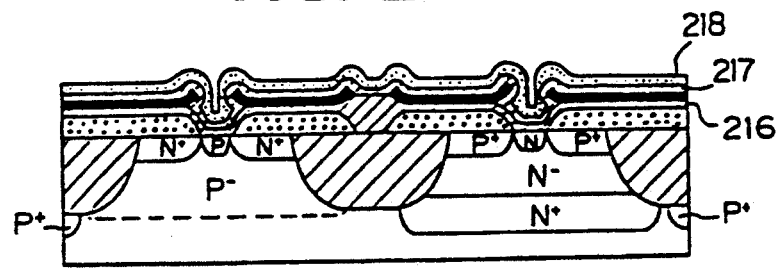
Figure 2E:
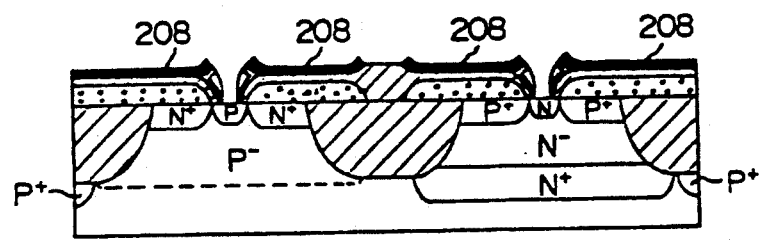
Figure 2F:
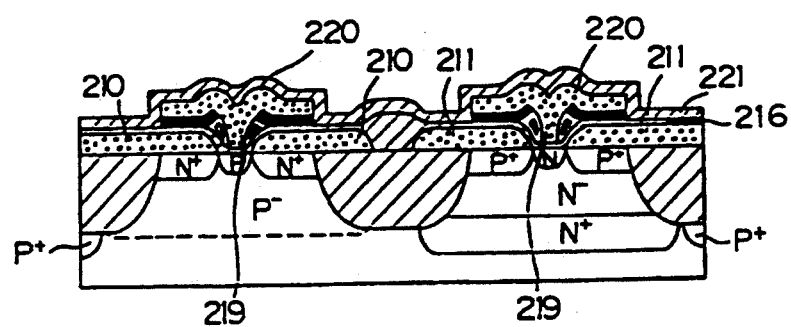

Finally, the oxide films 116a, 116b, 116c, 116d, 118a, 118b, 118c and 118d on the surfaces of the respective polysilicon electrodes 115a, 115b, 115c, 115d, 107b, 107c, 107d and 107e, respectively, are washed out with buffered hydrofluoric acid and the resultant exposed surfaces of the polysilicon electrodes are formed with metal silicides (self-aligned silicide) (selective formation of metal silicide) 120a, 120b, 120c, 120d, 120e, 120f, 120g and 120h by a known technique and deposited with an insulating film 121, for example, by the use of a vapor phase chemical growth method, followed by formation of contacts by photoetching and formation of metal wirings 122a, 122b, 122c, 122d, 122e, respectively. [FIG. 1(L)]

INDUSTRIAL UTILIZATION

As will become apparent from the foregoing description, the method of fabricating semiconductor devices according to the invention can realize fabrication of complementary bipolar transistor and complementary MOS transistors applicable to high speed, high integration LSIs.

I claim:

1. A method for fabricating complementary integrated circuit transistors comprising the steps of:

forming polysilicon regions laterally separated from each other by insulator regions over a first N type region and a first P type region of a semiconductor body, the polysilicon regions having first polysilicon regions and second polysilicon regions, the first polysilicon region being covered with nitride, the second polysilicon regions not being covered with nitride;

forming a second N type region of higher relative impurity concentration in the first N type region and forming a second P type region of higher relative impurity concentration in the first P type region;

forming oxide layers over the second N type and P type regions;

forming respective electrodes for each of the second N type and P type regions and for the second polysilicon regions, the electrodes for the second N type and P type regions being located between adjacent ones of the first polysilicon regions and insulated therefrom;

selectively implanting first and second types of impurities into selected electrodes, including selectively implanting the first type of impurity into selected electrodes and performing a low temperature thermal oxidation to form a first oxide film thereon, and then implanting the second type of impurity into the remaining electrodes;

selectively forming third P type regions in the first N type region and forming third N type regions in the first P type region; and removing the first oxide film from the upper surfaces of the electrodes and forming contacts and interconnects thereto.

2. The method of claim 1 wherein the third N type and P type regions are formed by selectively removing the nitride from selected first polysilicon regions, selectively implanting the first type of impurity into selected the first polysilicon regions and performing a low temperature thermal oxidation to form a second oxide film on the selected first polysilicon regions, then removing the nitride from the remaining first polysilicon regions, and selectively implanting the second type of impurity into the remaining first polysilicon regions.

3. The method of claim 1 wherein said steps of forming the second P type and N type regions and forming electrodes includes:

removing selected ones of said insulator regions from between the adjacent first polysilicon regions to leave side walls thereof facing each other; and establishing side wall insulation on said side walls and opening windows over the second N type and P type regions.

4. The method of claim 3 further comprising establishing a polysilicon remnant within the windows and between the side wall insulation.

5. The method of claim 4 wherein said steps of establishing said side wall insulation and the polysilicon remnants comprises adding a layer of oxide after said step of removing selected ones of the insulator regions, then adding a layer of polysilicon, and then anisotropically ething to leave insulation and the remnants on the inner side walls exposed as a result of said step of removing selected insulator regions.

6. The method of claim 1 wherein said first-named forming step includes forming nitride on all of the first and second polysilicon regions and oxidizing to form the insulator regions, then removing the nitride from the second polysilicon regions, then implanting the body beneath selected ones of the first and second polysilicon regions.

* * * * *